United States Patent [19]
Alford et al.

[11] Patent Number: 6,008,102
[45] Date of Patent: Dec. 28, 1999

[54] METHOD OF FORMING A THREE-DIMENSIONAL INTEGRATED INDUCTOR

[75] Inventors: Ronald C. Alford, Plantation; Robert E. Stengel, Pompano Beach; Douglas H. Weisman, Sunrise, all of Fla.; George W. Marlin, Phoenix, Ariz.

[73] Assignee: Motorola, Inc., Schaumburg, Ill.

[21] Appl. No.: 09/056,967

[22] Filed: Apr. 9, 1998

[51] Int. Cl.⁶ .................................................. H01L 29/00
[52] U.S. Cl. .......................... 438/381; 257/531; 336/200; 29/602.1
[58] Field of Search ............................ 438/381; 257/531, 257/74, 231, 278, 528; 29/602.1; 336/200

[56] References Cited

U.S. PATENT DOCUMENTS

| | | | |
|---|---|---|---|
| 3,290,753 | 12/1966 | Moyer | 29/155.5 |
| 3,305,814 | 2/1967 | Moyer | 336/200 |
| 3,881,244 | 5/1975 | Kendall | 29/602.1 |
| 4,494,100 | 1/1985 | Stengel | 336/200 |
| 4,729,510 | 3/1988 | Landis | 336/200 |
| 4,785,345 | 11/1988 | Rawls et al. | 357/51 |
| 5,070,317 | 12/1991 | Bhagat | 336/200 |
| 5,095,357 | 3/1992 | Andoh et al. | 357/51 |
| 5,111,169 | 5/1992 | Ikeda | 333/181 |
| 5,174,012 | 12/1992 | Hamilton | 29/603 |
| 5,349,743 | 9/1994 | Grader et al. | 29/602.1 |
| 5,372,967 | 12/1994 | Sundaram et al. | 438/381 |
| 5,446,311 | 8/1995 | Ewen et al. | 257/531 |
| 5,450,263 | 9/1995 | Desaigoudar et al. | 438/381 |
| 5,451,914 | 9/1995 | Stengel | 333/25 |
| 5,478,773 | 12/1995 | Dow et al. | 437/60 |
| 5,576,680 | 11/1996 | Ling | 336/200 |
| 5,767,563 | 6/1998 | Imam et al. | 257/531 |
| 5,884,990 | 3/1999 | Burghartz et al. | 336/200 |

FOREIGN PATENT DOCUMENTS

| | | | |
|---|---|---|---|
| 36 0138954 | 7/1985 | Japan | 257/531 |
| 36 1144052 | 7/1986 | Japan | 257/531 |
| 36 1179562 | 8/1986 | Japan | 257/531 |
| 64-73658 | of 1989 | Japan . | |
| 40 2069971 | 3/1990 | Japan | 257/531 |
| 2 211 987 | of 0000 | United Kingdom . | |
| 2 269 935 | of 0000 | United Kingdom . | |

OTHER PUBLICATIONS

Young, D.J., Malba, V., Ou, J–J, Bernhardt, A.F., Boser, B.E., "Monolithic High–Performance Three–Dimensional Coil Inductors for Wireless Communication Applications," IEDM Department of Electrical Engineering and Computer Sciences, University of California, Berkeley, CA, presented at the International Electronic Devices Meeting, Dec. 1997.

High Q Inductor Merges with CMOS, presented at the International Electronic Devices Meeting, Dec. 1997, IEEE 1998.

Ahn, C.H., Kim, Y.J., Allen, M.G., "A Fully Integrated Planar Toroidal Inductor with a Micromachined Nickel–Iron Magnetic Bar," IEEE Transactions on Components, Packaging and Manufacturing Technology, vol. 17, No. 3, Sep. 1994.

*Primary Examiner*—Donald L. Monin, Jr.
*Assistant Examiner*—Michael Dietrich
*Attorney, Agent, or Firm*—Barbara R. Doutre

[57] ABSTRACT

A three-dimensional inductor coil is fabricated on top of a semiconductor substrate. The fabrication process includes the steps of depositing a first photoresist layer (406), forming a trench therein, and filling the trench with electroplated metal (404). A second photoresist layer (408) is deposited, and first and second trenches (410) are formed therein and filled with electroplated metal (412). A third photoresist layer (416) is deposited and a trench (418) formed therein, and then filled with electroplated metal (420). The first, second, and third photoresist layers (406, 408, 416) are then removed to expose a multi-loop inductor coil (500, 550).

9 Claims, 5 Drawing Sheets

LAYER 1

LAYER 2

LAYER 3

LAYERS 1, 2 & 3
500

LAYERS 1, 2 & 3

550

LAYERS 1, 2 & 3

650

METHOD OF FORMING A THREE-DIMENSIONAL INTEGRATED INDUCTOR

TECHNICAL FIELD

This invention relates in general to inductors and more specifically to integrated inductors.

BACKGROUND

The limited availability of low-loss integrated inductor structures has long hindered the development of integrated circuits (IC) such as passive filters, voltage controlled oscillators (VCO)s, matching networks, and transformers. Today's portable communications environment strives to achieve more fully integrated circuits that operate at radio frequency (RF) and microwave frequencies. Recent trends indicate a push to integrate entire receivers onto a single substrate.

Most radio receivers are built in bipolar or gallium arsenide (GaAs) technologies, and some integrated planar spiral inductors have been developed which are compatible with widespread silicon-based integrated circuit fabrication processes. However, these planar inductors tend to suffer from high losses and low quality factors (Q) at radio frequencies. These losses and low Q factors are generally attributable to dielectric losses incurred from parasitic capacitances and resistive losses due to the use of thin and relatively high resistivity conductors.

FIG. 1 shows a conventional planar spiral inductor 102 formed on an integrated circuit substrate 104. Typically the planar spiral 102 is formed of a relatively thick copper trace deposited on a silicon substrate. There are several problems that stem from this construction. Firstly, magnetic field lines generated from the RF current flowing in the planar inductor 102 can be represented in the form of closed loops 106 beginning and ending in the center of the planar spiral inductor. The collection of loops 106 forms the shape of a toroid enclosing the spiral inductor 102. As indicated in FIG. 1, the plane containing each individual loop of magnetic field lines is perpendicular to the surface of the integrated planar spiral 102. Thus, the magnetic field lines enter any material above, beside, and below the planar spiral inductor as they complete the closed loop path dictated by Maxwell's equations governing electromagnetics. The observation that the magnetic field lines penetrate the dielectric materials above, beside, and especially below the spiral inductor is very important, because it is in these dielectric materials that losses occur which lower the quality factor of the inductor.

Secondly, unless the spiral inductor is placed far enough away from underlying circuits embedded in the silicon substrate of the IC, the magnetic field generated by the inductor may induce currents in (and therefore disrupt the operation of) underlying integrated circuits. Thirdly, if two planar spirals are placed in close proximity to one another, some degree interaction and cross-coupling will occur between the linked magnetic fields of the two inductors.

Finally, a thin lossy conductor 108 must be located on an underlying metal layer in order to bring a center tap 110 of the spiral inductor 102 to the outside edge of the substrate. This thin underlying conductor 108 adds substantial resistance and parasitic capacitance, along with associated conducted and dielectric losses, which further lower the quality factor of the inductor.

FIG. 2 shows a cross-sectional view of a three-dimensional integrated inductor structure 200 in which copper traces 202 are electroplated around an insulating core 204. However, the insulating core 204 is typically formed of alumina which tends to be too lossy for many high frequency applications, such as multi-GHz VCOs. The use of an insulating core also increases the complexity of the fabrication process and limits the minimum height of the structure to the thickness of a commercially available alumina sheet. Furthermore, the Q factor of these structures is further limited by lossy adhesives 206 generally used in the fabrication process. Hence, it would be desirable from both a design and manufacturing standpoint to eliminate the insulating core while maintaining or increasing the Q factor.

Accordingly, there is a need for a fabrication process which will allow for the implementation of practical integrated RF inductor structures using standard IC processes. A process which provides for the formation of a toroidal and horizontal helical inductor without the use of an insulating core is desirable in order to ease the fabrication process as well as to reduce losses.

DETAILED DESCRIPTION OF THE PREFERRED EMBODIMENT

Figure 1:
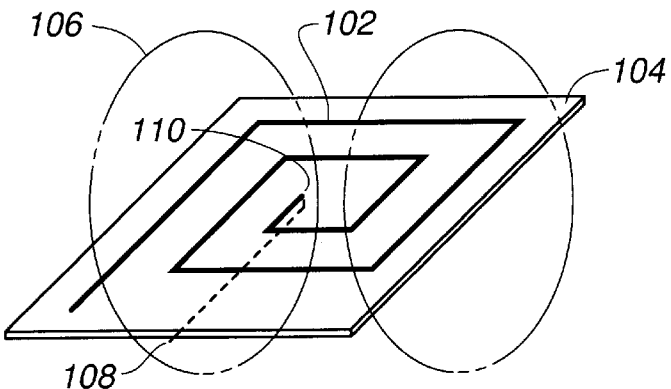
FIG. 1 is a conventional planar spiral inductor formed on an integrated circuit substrate.
Figure 2:
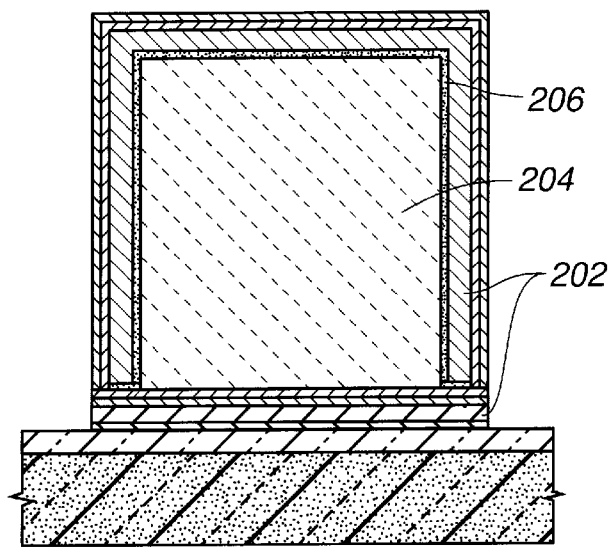
FIG. 2 is a cross sectional view of a three-dimensional integrated inductor structure having an insulating core.

While the specification concludes with claims defining the features of the invention that are regarded as novel, it is believed that the invention will be better understood from a consideration of the following description in conjunction with the drawing figures, in which like reference numerals are carried forward.

A process for implementing a single layer of relatively thick (>20 micron) electroplated copper in order to form a planar spiral inductor has been described in U.S. Pat. No. 5,478,773 by Dow et al. and assigned to Motorola, Inc. which is hereby incorporated by reference. The fabrication process to be described herein is an extension of that work to a three layer process to be used to implement three-dimensional integrated inductor structures.

Figure 3:
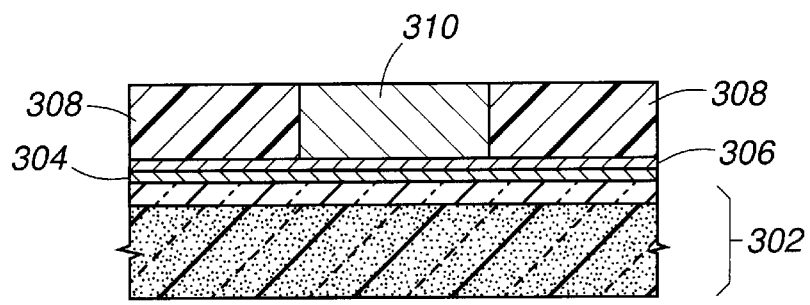
FIG. 3 is a cross sectional view of a prior art planar spiral inductor integrated over a semiconductor substrate.

Briefly, FIG. 3 shows a cross sectional view of a processing step for integrating a planar spiral inductor integrated over a semiconductor substrate in accordance with the Dow patent. A passivated IC wafer 302 is first coated with a thin sputtered layer of metal(s), such as titanium—tungsten (TiW) 304 to form a barrier layer and provide for the adhesion of a subsequent sputtered layer of copper 306. A thick layer of photoresist 308 is then applied, using for example, spin-on techniques, over the top of the sputtered copper layer 306 and exposed. The exposed pattern is then removed from the photoresist 308, leaving behind a spiral trench within which to deposit electroplated copper 310 in the form of a spiral inductor.

The patterned photoresist serves as a mask during the copper electroplating process. During the electroplating step, the top of the passivated wafer 302 can be made to conduct plating current through the sputtered TiW and copper layers 304, 306 respectively beneath the photoresist 308 by connecting a cathode lead (not shown) to the wafer along the wafer's edge. This allows current to flow from the anode in a copper solution to the cathode lead along the wafer's edge, depositing a thick layer of electroplated copper 310 along the photoresist trench in the process. Plating times and photoresist thickness are two of the parameters to be controlled to produce a deposited thickness and grain size for the resulting plated copper 310.

Once the plated copper 310 has been deposited, an etch is performed to remove the photoresist 308 and another etch is performed to remove the sputtered copper and sputtered TiW layers 304, 306 from the top of the IC passivation layer 302, electrically isolating the planar spiral inductor. Connections to the ends of the planar spiral inductor are made though via holes in the wafer passivation layer 302 that allows the sputtered and plated metal layers to contact the metalization layers within the IC itself.

The fabrication process of the present invention expands the single layer process described above to three dimensions. This expansion allows the formation of integrated toroidal and horizontal helical inductor structures that have much higher inductance per unit area and lower losses than previously conceived integrated inductor structures. Additionally, the fabrication process of the present invention allows for the implementation of practical integrated RF transformer structures.

Figure 4:
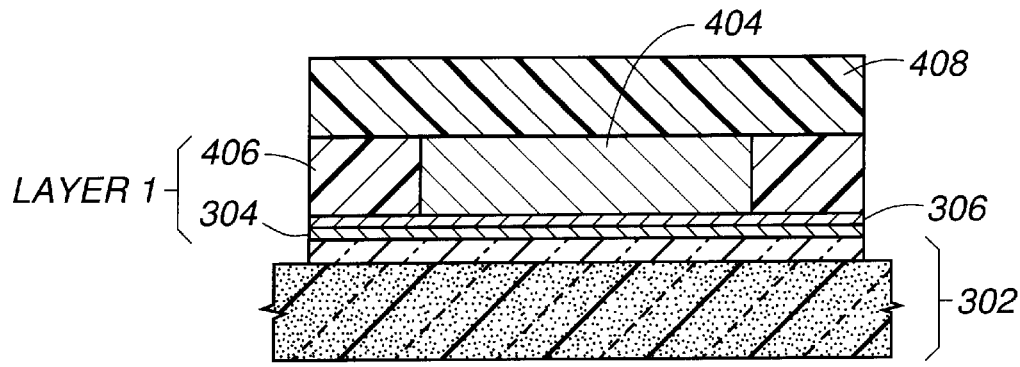
FIGS. 4–10 are cross sectional views of the fabrication process for a three-dimensional integrated inductor in accordance with the present invention.

FIGS. 4–10 (not to scale) show cross sectional views of the fabrication process steps for a three-dimensional integrated inductor structure in accordance with the present invention. Referring first to FIG. 4, a first layer (LAYER 1) is produced in a similar manner to that described in FIG. 3 except that, once an initial plated metal layer 404 is complete, the initial photoresist layer 406 is not removed. A second layer of thick photoresist 408 is spun to cover the initial photoresist 406 as well as the initial plated metal 404 patterned therein.

Figure 5:
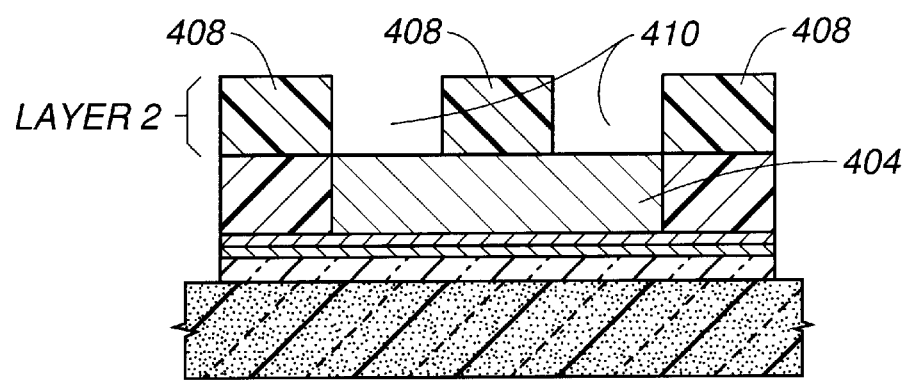
Figure 6:
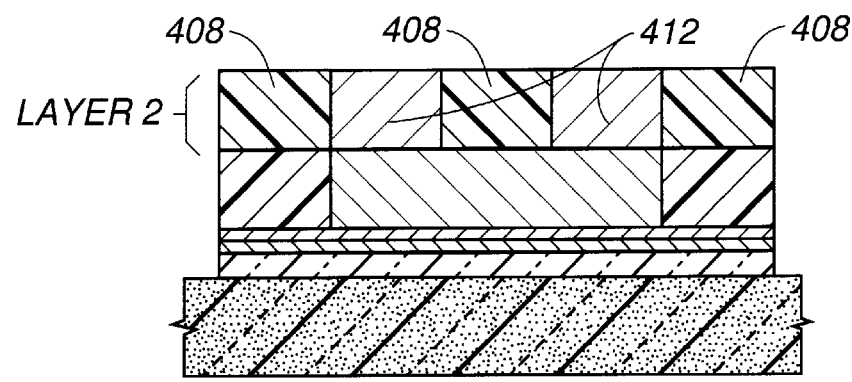

The second layer photoresist 408 is exposed, developed, and etched to define a second layer (LAYER 2) of trenches 410 as shown in FIG. 5. Thus, the bottoms of the second layer trenches 410 are a portion of the top of the initial layer of plated metal 404. This allows for plating current to flow in a second plating step shown in FIG. 6 in which the second layer photoresist trenches 410 are filled with a second thick layer of metal 412 providing a good electrical contact with the initial plated layer 404.

Figure 7:
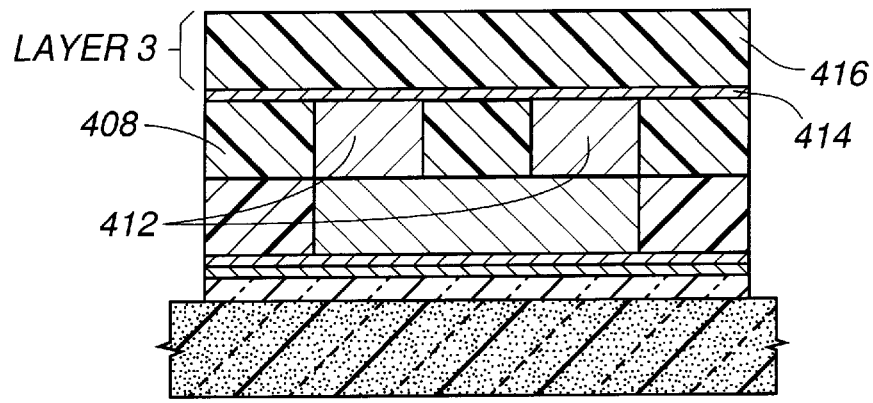
Figure 8:
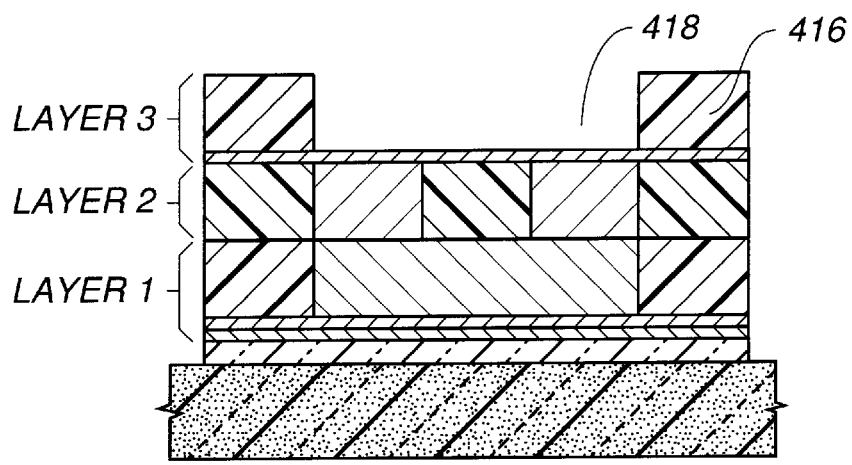
Figure 9:
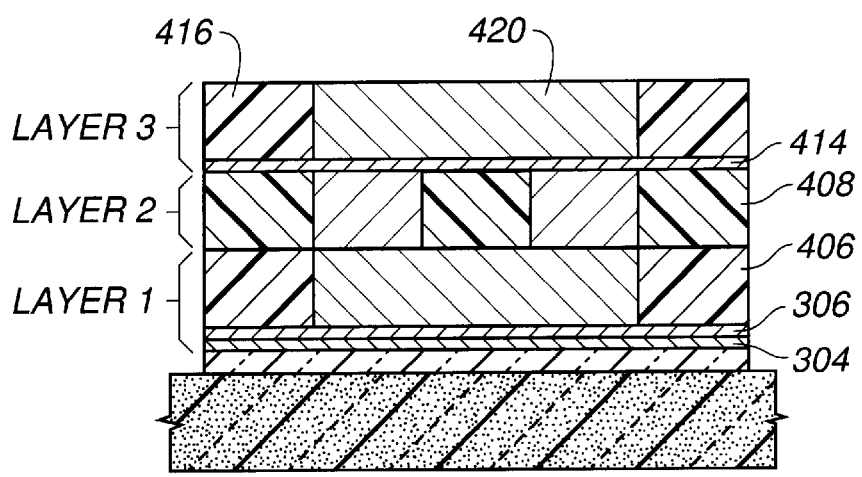

To plate a third layer (LAYER 3), the top of the second photoresist layer 408 and the tops of the second plated metal layer 412 are covered with a sputtered conductor 414, such as copper or TiW, as shown in FIG. 7. The sputtered conductor 414 serves as the cathode conductor upon which to deposit a third plated metal layer over the areas that do not have an underlying second plated copper layer 412. A third layer of photoresist 416 is applied over the sputtered conductor 414. The third layer of photoresist 416 is exposed, developed, and etched to provide a third layer trench 418, as shown in FIG. 8. A third layer of plated metal 420, such as plated copper, is deposited within trench 418 as shown in FIG. 9. As will be recognized by those skilled in the art, a variety of metals and alloys may be employed for the various metal layers throughout the structure.

Figure 10:
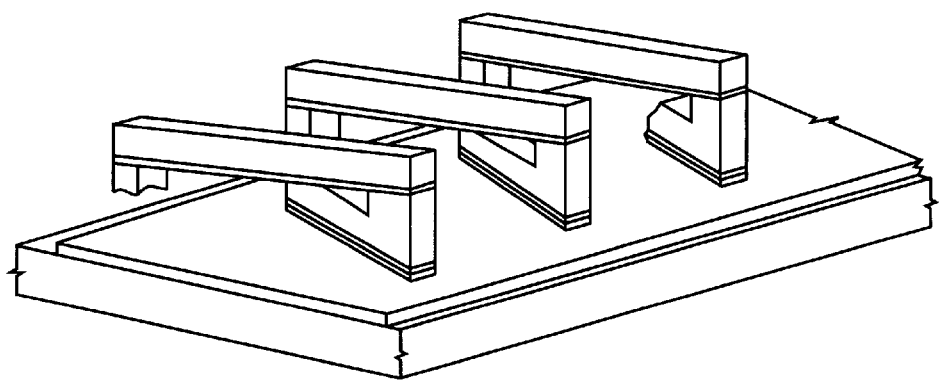

Once all three layers of metal 404, 412, and 420 have been plated onto the wafer to form a three-dimensional conducting structure, an etching material is applied to remove the photoresist layers 406, 408, 416 and the sputtered metal layers 304, 306, and 414 thereby electrically isolating the finished inductor structure 450 as shown in the perspective view of FIG. 10. Hence, a series of multiple loops have been formed which sit perpendicular to the plane of the substrate.

The resulting inductor structure 450 can be configured as a series of loops whose centers are either on a straight line parallel to the surface of the integrated circuit (horizontal helical) or on a circle with a circumference that is parallel to the surface of the integrated circuit (toroid).

Figure 11:
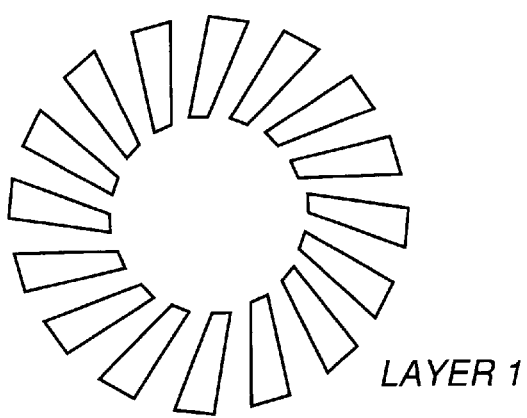
FIGS. 11–14 are top down views of a possible set of mask patterns for implementing a toroidal inductor in accordance with the present invention.
Figure 12:
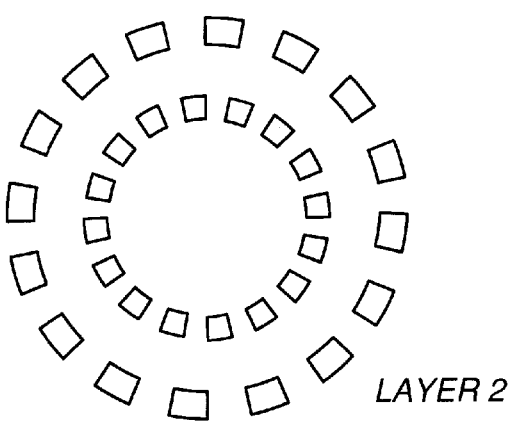
Figure 13:
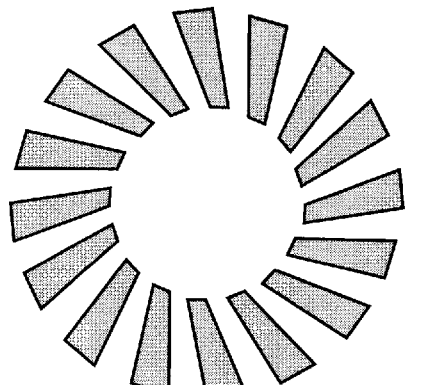
Figure 14:
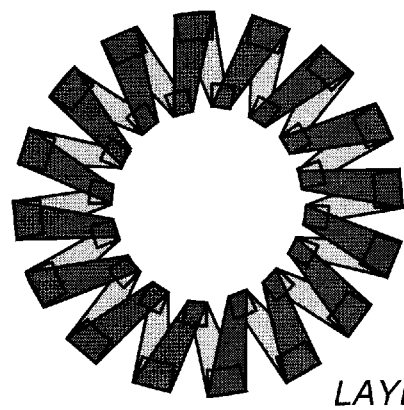

FIGS. 11–14 are top down views of a possible set of mask patterns for implementing a toroidal inductor in accordance with the present invention. FIG. 11–14 show the individual electroplated metal layers once the photoresist and sputtered metal layers are removed. FIG. 11 is a top down view of LAYER 1. FIG. 12 is a top down view of LAYER 2. FIG. 13 is a top down view of LAYER 3. FIG. 14 is a top down view of the combined LAYERS 1, 2, and 3 aligned to create a complete toroidal inductor 500. This sixteen turn inductor 500 can be realized on silicon in an area of less that 200×200 microns using the fabrication process described by the invention.

Figure 15:
FIG. 15 is a top down view of a possible helical inductor structure in accordance with the present invention.

Several varieties of toroidal and horizontal helical inductors can be achieved using the plating process described by the invention. FIG. 15 shows an example of a top down view of completed helical coil 550 formed in accordance with the plating process described by the invention. The three-dimensional integrated multi-turn inductor coil described-by the invention is thus formed in three steps, the bottom turns of the multi-turn coil are formed in one step, then the side walls are formed in another step, and finally the tops of the multi-turn coil are formed in another step. The successive steps of depositing photoresist, forming trenches therein, and filling the trenches with electroplated metal and repeating these steps to create a three-dimensional inductor structure are believed to be novel.

Figure 16:
FIG. 16 is a top down view of a possible double helical inductor structure in accordance with the present invention.

The fabrication process described by the invention can be expanded to the creation of transformer structures as well as single inductor structures. FIG. 16 shows an example of a top down view of a completed transformer structure 650 formed in accordance with the plating process described by the invention. The three layer plating process is used to create a three-dimensional structure forming at least two electrically independent but physically intertwined multi-turn coils. As with the single inductor structure, all of the bottoms of the turns are formed on layer 1, all the sides of the turns are formed on layer 2, and all the tops of the turns are formed on layer 3. While shown as a 1:1 transformer, one skilled in the art appreciates that the creation of multi-port transformers can be achieved by simply creating various break points in the structure. Both helical and toroidal transformer structures can now be formed on top of an integrated circuit using the three dimensional plating process described by the invention.

Accordingly, there has been provided a process for forming integrated toroidal and horizontal helical inductor structures using the novel three-layer copper electroplating process described by the invention. The resulting three-dimensional structures allow the magnetic fields produced by RF currents to be contained within the core of the toroid (or substantially along the axis of the horizontal helix) which minimizes dielectric losses and cross-talk with underlying circuitry or adjacent inductors.

The three layer electroplating process described by the invention allows three-dimensional structures to be created on top of a semiconductor substrate. These structures align magnetic fields parallel to the surface of the IC thereby minimizing dielectric losses and reducing interaction with active circuits located below the inductor. Since the fields run substantially parallel to the IC surface, inductors formed in accordance with the invention can be placed adjacent to each other with minimum interaction and without large keep-out areas in the underlying IC.

The three-dimensional integrated inductor structure described by the invention has the advantages of being self-shielding, and the strength of the magnetic field within the core increases as the number of loops is increased. From both a manufacturing and design standpoint, the formation process is advantageous, because it involves metal depositions onto successive planar layers which avoids conductor discontinuity problems and provides for substantial size flexibility in the final structure.

Finally, connections to the toroidal inductor or horizontal helical inductor described by the invention can be made on the thick copper metal layer without the use of a lengthy, lossy, inner layer metal conductor. All of these features of the three-dimensional integrated toroidal inductor and horizontal helical inductor serve to increase the quality factor and inductance per unit area of the resulting inductor.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of forming an integrated multi-turn inductor coil, comprising the steps of:
   providing a semiconductor substrate;
   forming the bottoms of the turns by:
      depositing, over the semiconductor substrate, a first photoresist layer and forming a trench therein;
      filling the trench with electroplated metal, the first photoresist layer and electroplated trench forming a first layer;
   forming the sides of the turns by:
      depositing, over the first layer, a second photoresist layer and forming first and second trenches therein;
      filling the first and second trenches with electroplated metal, the second photoresist layer and first and second electroplated trenches forming a second layer;
   forming the tops of the turns by:
      depositing, over the second layer, a third photoresist layer and forming a trench therein;
      filling the trench of the third photoresist layer with electroplated metal; and
   removing the first, second, and third photoresist layers to expose a three-dimensional multi-turn inductor coil.

2. A method of forming an integrated transformer, comprising the steps of:
   forming at least two electrically independent but physically intertwined multi-turn coils by:
      providing a semiconductor substrate;
      forming the bottoms of each of the at least two multi-turn coils by:
         depositing, over the semiconductor substrate, a first photoresist layer and forming a trench therein;
         filling the trench with electroplated metal, the first photoresist layer and electroplated trench forming-a first layer;
      forming the sides of each of the at least two multi-turn coils by:
         depositing, over the first layer, a second photoresist layer and forming first and second trenches therein;
         filling the first and second trenches with electroplated metal, the second photoresist layer and first and second electroplated trenches forming a second layer;
      forming the tops of each of the at least two multi-turn coils by:
         depositing, over the second layer, a third photoresist layer and forming a trench therein;
         filling the trench of the third photoresist layer with electroplated metal thereby forming a third layer; and
   removing the first, second, and third photoresist layers to expose the at least two multi-turn coils.

3. The method of claim 2, wherein the steps of forming the bottoms, forming the sides, and forming the tops of each of the at least two multi-turn coils comprises the steps of simultaneously forming two sets of bottom turns on the first layer, simultaneously forming two sets of side turns on the second layer, and simultaneously forming two sets of top turns on the third layer to provide a 1:1 transformer.

4. The method of claim 2, wherein the steps of forming the bottoms, forming the sides, and forming the tops of each of the at least two multi-turn coils comprises the steps of simultaneously forming more than two sets of bottom turns on the first layer, simultaneously forming more than two sets of side turns on the second layer, and simultaneously forming more than two sets of top turns on the third layer to provide a multi-port transformer.

5. A method of forming an integrated inductor, comprising:
   providing a semiconductor substrate;
   depositing a passivation layer over the substrate;
   depositing a first sputtered metal layer onto the dielectric layer thereby forming a barrier layer;
   depositing a second sputtered metal layer onto the first sputtered metal layer, the second sputtered metal layer adhering to the first sputtered metal layer;
   depositing a first photoresist layer onto the second sputtered metal layer;
   forming a first trench within the first photoresist layer so as to expose a top portion of the second sputtered metal layer;
   depositing a first plated metal layer within the first trench, the first photoresist layer and the first plated metal layer providing a first layer of the inductor;
   depositing a second photoresist layer over the first layer of the inductor;
   forming first and second trenches within the second photoresist layer, the first and second trenches each exposing a top portion of the first plated metal layer;
   depositing a second plated metal layer within each of the first and second trenches of the second photoresist layer, the second photoresist layer and first and second plated trenches formed therein providing a second layer of the inductor;
   depositing a third sputtered metal layer over the second layer of the inductor;
   depositing a third photoresist layer over the third sputtered metal layer;
   forming a trench within the third photoresist layer;

depositing a third plated metal layer within the trench of the third photoresist layer, the third photoresist layer and the third plated metal layer providing a third layer of the inductor; and etching the first, second, and third photoresist layers and the first, second, and third sputtered metal layers to expose the first, second, and third plated metal layers to expose a multi-turn coil.

6. The method of claim 5, wherein the inductor comprises a toroidal inductor.

7. The method of claim 5, wherein the inductor comprises a helical inductor.

8. The method of claim 5, wherein two electrically independent but physically intertwined multi-turn coils are formed to provide a transformer.

9. The method of claim 5, wherein more than two electrically independent but physically intertwined multi-turn coils are formed to provide a multi-port transformer.

* * * * *